(12) United States Patent
Bangsaruntip et al.

(10) Patent No.: US 8,524,544 B2
(45) Date of Patent: Sep. 3, 2013

(54) MOSFET WITH A NANOWIRE CHANNEL AND FULLY SILICIDED (FUSI) WRAPPED AROUND GATE

(75) Inventors: Sarunya Bangsaruntip, Mount Kisco, NY (US); Guy Cohen, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/468,307

(22) Filed: May 10, 2012

(65) Prior Publication Data
US 2012/0225525 A1 Sep. 6, 2012

Related U.S. Application Data

(63) Continuation of application No. 12/561,694, filed on Sep. 17, 2009, now Pat. No. 8,241,971.

(51) Int. Cl.
*H01L 21/00* (2006.01)
(52) U.S. Cl.
USPC .............................. 438/151; 257/9; 977/762
(58) Field of Classification Search
USPC .................. 438/300, 151; 977/762
See application file for complete search history.

(56) References Cited

U.S. PATENT DOCUMENTS

| 6,388,327 | B1 | 5/2002 | Giewont et al. |
| 6,905,922 | B2 | 6/2005 | Lin et al. |
| 7,504,329 | B2 | 3/2009 | Yu et al. |
| 7,524,716 | B2 | 4/2009 | Ting et al. |
| 2009/0050976 | A1 | 2/2009 | Mehrad et al. |
| 2009/0061568 | A1* | 3/2009 | Bangsaruntip et al. ....... 438/151 |
| 2009/0085126 | A1 | 4/2009 | Yu et al. |

FOREIGN PATENT DOCUMENTS

EP EP1804286 A1 7/2007

OTHER PUBLICATIONS

Lee et al., "Gate Stack Technology for Nanoscale Devices," Materials Today, vol. 9, No. 6 (Jun. 2006).

* cited by examiner

*Primary Examiner* — Julio J Maldonado
*Assistant Examiner* — Robert Bachner
(74) *Attorney, Agent, or Firm* — Vazken Alexanian; Michael J. Chang, LLC

(57) ABSTRACT

Nanowire-channel metal oxide semiconductor field effect transistors (MOSFETs) and techniques for the fabrication thereof are provided. In one aspect, a MOSFET includes a nanowire channel; a fully silicided gate surrounding the nanowire channel; and a raised source and drain connected by the nanowire channel. A method of fabricating a MOSFET is also provided.

16 Claims, 6 Drawing Sheets

CROSS-SECTIONAL VIEW (A1-A2)

TOP-DOWN VIEW

CROSS-SECTIONAL VIEW (A1-A2)

TOP-DOWN VIEW

CROSS-SECTIONAL VIEW (A1-A2)

TOP-DOWN VIEW

CROSS-SECTIONAL VIEW (B1-B2)

TOP-DOWN VIEW

CROSS-SECTIONAL VIEW (B1-B2)

CROSS-SECTIONAL VIEW (C1-C2)

TOP-DOWN VIEW

CROSS-SECTIONAL VIEW (B1-B2)

CROSS-SECTIONAL VIEW (C1-C2)

TOP-DOWN VIEW

CROSS-SECTIONAL VIEW (B1-B2)

CROSS-SECTIONAL VIEW (C1-C2)

TOP-DOWN VIEW

MOSFET WITH A NANOWIRE CHANNEL AND FULLY SILICIDED (FUSI) WRAPPED AROUND GATE

CROSS-REFERENCE TO RELATED APPLICATIONS

This application is a continuation of U.S. application Ser. No. 12/561,694 filed on Sep. 17, 2009, the contents of which are incorporated by reference herein.

FIELD OF THE INVENTION

The present invention relates to metal oxide semiconductor field effect transistors (MOSFETs), and more particularly, to nanowire-channel MOSFETs and techniques for the fabrication thereof.

BACKGROUND OF THE INVENTION

In a conventional process flow for a nanowire-based field effect transistor (FET), a nanowire (the FET channel) is formed by patterning a silicon-on-insulator (SOI) layer (or a silicon-on-silicon germanium (SiGe) film). The nanowire is suspended by etching the buried oxide (BOX) under the SOI layer (or etching the SiGe film). Suspension of the nanowire is needed so that a gate conductor can be placed under the nanowire (in addition to on the sidewalls and top surfaces thereof). Such a gate configuration is also commonly referred to as a "wrapped-around" gate, since the gate wraps around the circumference of the nanowire channel. The definition of a wrapped-around gate by reactive ion etching (RIE) is challenging since some amount of isotropic etching is needed to clear the gate material shadowed by the suspended nanowire (the gate material that is beneath the nanowire in regions which are not part of the gated channel region). While an isotropic sideways etch is effective at removing the gate material beneath the nanowire, this process also attacks the rest of the gate line. This effect is particularly problematic when the gate line dimensions are comparable to the amount of shadowed gate material that is targeted by the isotropic etch. The isotropic etch can substantially trim the gate line, which leads to a poor control over the gate line dimensions.

Therefore, improved techniques for fabricating nanowire-based MOSFETs with a wrapped-around gate would be desirable.

SUMMARY OF THE INVENTION

The present invention provides nanowire-channel metal oxide semiconductor field effect transistors (MOSFETs) and techniques for the fabrication thereof. In one aspect of the invention, a MOSFET includes a nanowire channel; a fully silicided gate surrounding the nanowire channel; and a raised source and drain connected by the nanowire channel.

In another aspect of the invention, a method of fabricating a MOSFET is provided which includes the following steps. A nanowire channel is formed. A fully silicided gate is formed surrounding the nanowire channel. A raised source and drain are formed connected by the nanowire channel.

A more complete understanding of the present invention, as well as further features and advantages of the present invention, will be obtained by reference to the following detailed description and drawings.

DETAILED DESCRIPTION OF PREFERRED EMBODIMENTS

Figure 1:
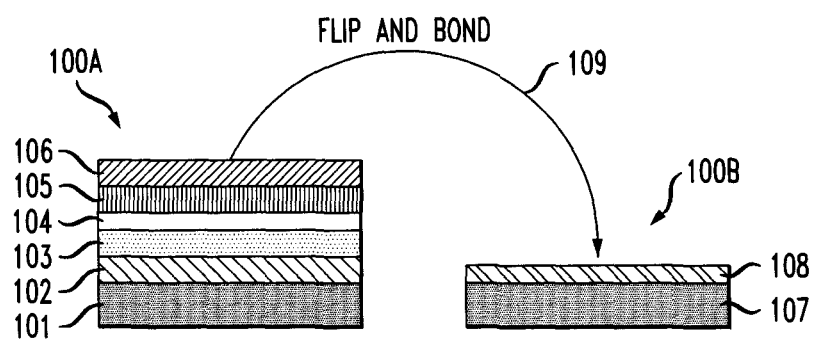
FIG. 1 is a cross-sectional diagram illustrating a wafer bonding process being used to integrate a first and a second wafer according to an embodiment of the present invention.

FIGS. 1-23 are diagrams illustrating an exemplary methodology for fabricating a nanowire-based metal oxide semiconductor field effect transistor (MOSFET). FIG. 1 is a cross-sectional diagram illustrating a wafer bonding process being used to integrate two wafers, i.e., a first wafer 100A and a second wafer 100B. As shown in FIG. 1, first wafer 100A and second wafer 100B are provided. According to an exemplary embodiment, wafer 100A includes a donor substrate 101, a buried oxide (BOX) layer 102 over donor substrate 101, a silicon-on-insulator (SOI) layer 103 over a side of BOX layer 102 opposite donor substrate 101, a back gate (BG)-oxide layer 104 over a side of SOI layer 103 opposite BOX layer 102, poly-silicon (poly-Si) layer 105 over a side of BG-oxide layer 104 opposite SOI layer 103 and oxide layer 106 over a side of poly-Si layer 105 opposite BG-oxide 104. Wafer 100B includes a host substrate 107 and a BOX layer 108 over host substrate 107. Donor substrate 101 and host substrate 107 can both be silicon (Si) substrates.

As indicated by arrow 109, wafer 100A is flipped and bonded to wafer 100B, e.g., by way of an oxide-to-oxide bond between oxide layer 106 (of wafer 100A) and BOX layer 108 (of wafer 100B). Wafer bonding processes including the conditions for forming such an oxide-to-oxide bond are known to those of skill in the art and thus are not described further herein.

Figure 2:
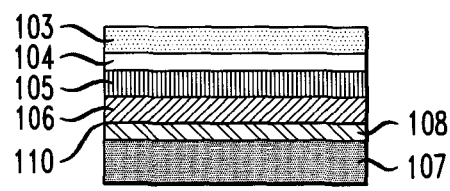
FIG. 2 is a cross-sectional diagram illustrating the first wafer and the second wafer having been bonded together according to an embodiment of the present invention.

FIG. 2 is a cross-sectional diagram illustrating the first wafer 100A and the second wafer 100B having been bonded together forming bonding interface 110 therebetween. As shown in FIG. 2, donor substrate 101 and BOX layer 102 (of wafer 100A) have been removed. Thus this step essentially involves a layer transfer process wherein layers are transferred from the donor substrate to the host substrate.

Donor substrate 101 (e.g., a Si substrate, see above) can be removed by wafer grinding. A typical wafer grinding process should leave about 10 micrometers (μm) of Si over BOX layer 102. The 10 μm thick Si that is left can then be etched selectively with respect to BOX layer 102 in potassium hydroxide (KOH) solution or tetramethylammonium hydroxide (TMAH). BOX layer 102 can then be etched selectively with respect to SOI layer 103 in diluted hydrofluoric acid (DHF). To prevent etching of the backside of host substrate 107 by the KOH, the backside of host substrate 107 can be coated with an oxide (not shown) that is removed when BOX layer 102 is stripped.

Another more cost-efficient method that can be used to remove donor substrate 101, without actually sacrificing donor substrate 101 so it can be reused later is known as the SmartCut™ process (developed by SOITEC, Bernin France). When SmartCut™ is used, donor substrate 101 is first implanted with hydrogen. BG-oxide layer 104, poly-Si layer 105 and oxide layer 106 are then formed on substrate 101 as described above (note that BOX layer 102 and SOI layer 103 would be omitted if this process is being used). The formation of BG-oxide layer 104, poly-Si layer 105 and oxide layer 106 is done at a temperature lower than the hydrogen blister formation temperature. Wafers 100A and 100B are then bonded and annealed at a temperature of about 1,000 degrees Celsius (° C.). The annealing temperature has to be higher than the hydrogen blister formation temperature. Blisters induced by hydrogen during annealing form a "cracking plane" at about the depth at which the hydrogen was implanted. As a result, donor substrate 101 is separated while donating a thin silicon film (the silicon above the cracking plane) that remains attached to BG-oxide layer 104. The silicon film donated from donor substrate 101 now serves as an SOI layer (analogous to SOI layer 103 in the embodiment depicted in FIG. 2).

Figure 3:
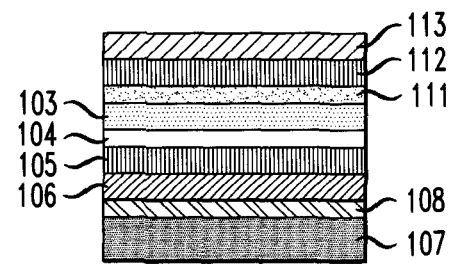
FIG. 3 is a cross-sectional diagram illustrating a top gate (TG)-oxide layer, a poly-silicon (poly-Si) layer and a hard mask layer having been formed on the bonded structure according to an embodiment of the present invention.

FIG. 3 is a cross-sectional diagram illustrating a top gate (TG)-oxide layer, a poly-Si layer and a hard mask layer having been formed on the bonded structure. Namely, as shown in FIG. 3, a TG-oxide layer 111 has been deposited over a side of SOI layer 103 opposite BG-oxide 104, a poly-Si layer 112 has been deposited over a side of TG-oxide layer 111 opposite SOI layer 103 and a hard mask layer 113 has been deposited over a side of poly-Si layer 112 opposite TG-oxide layer 111.

Figure 4:
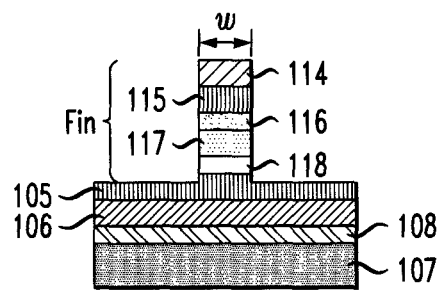
FIG. 4 is a cross-sectional diagram illustrating the structure of FIG. 3 having been patterned to form a fin according to an embodiment of the present invention.

FIG. 4 is a cross-sectional diagram illustrating the structure of FIG. 3 having been patterned to form a fin. Namely, as shown in FIG. 4, hard mask layer 113, poly-Si layer 112, TG-oxide layer 111, SOI layer 103 and BG-oxide layer 104 have been patterned, resulting in patterned hardmask 114, patterned poly-Si 115, patterned TG-oxide 116, patterned SOI 117 and patterned BG-oxide 118, respectively, that collectively form a fin. According to an exemplary embodiment, the fin has a width w of from about three nanometers (nm) to about 25 nm, preferably from about six nm to about 10 nm. The thickness of patterned SOI 117 can range from about three nm to about 25 nm, preferably from about six nm to about 10 nm. The thickness of patterned BG-oxide 118 can range from about one nm to about five nm and the thickness of patterned TG-oxide 116 can range from about one nm to about five nm. According to an exemplary embodiment, the fin etch is performed using reactive ion etching (RIE). The etch is stopped once BG-oxide layer 104 has been cleared. Some etching into poly-Si layer 105 is possible, as shown in FIG. 4.

Figure 5:
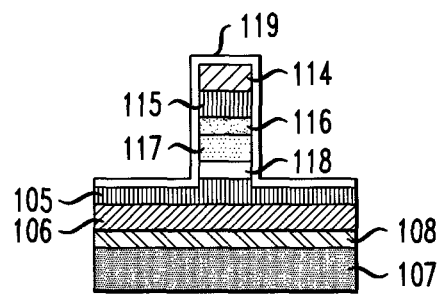
FIG. 5 is a cross-sectional diagram illustrating a thin dielectric film having been deposited over the fin and other exposed surfaces of the structure according to an embodiment of the present invention.

FIG. 5 is a cross-sectional diagram illustrating a thin dielectric film 119 having been deposited over the fin and top (exposed) surfaces of poly-Si layer 105. According to an exemplary embodiment, dielectric film 119 comprises hafnium oxide ($HfO_2$) and is conformally deposited over the structure using atomic layer deposition (ALD) or chemical vapor deposition (CVD) to a thickness of from about one nm to about five nm.

Figure 6:
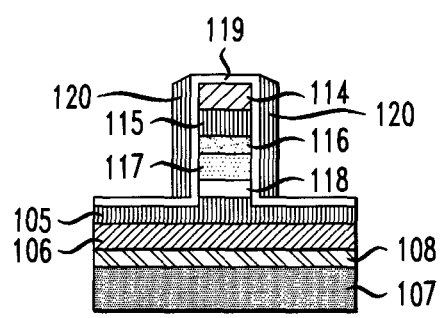
FIG. 6 is a cross-sectional diagram illustrating poly-Si spacers having been formed on opposite sides of the fin according to an embodiment of the present invention.

FIG. 6 is a cross-sectional diagram illustrating poly-Si spacers 120 having been formed on opposite sides of the fin. According to an exemplary embodiment, a poly-Si film is deposited over dielectric film 119 and etched by RIE to form poly-Si spacers 120.

Figure 7:
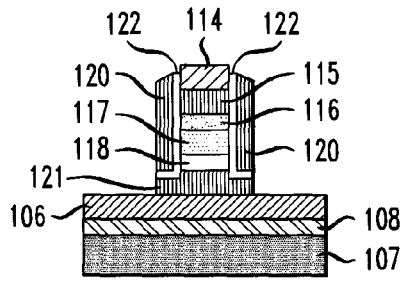
FIG. 7 is a cross-sectional diagram illustrating the dielectric film having been trimmed around the poly-Si spacers according to an embodiment of the present invention.

FIG. 7 is a cross-sectional diagram illustrating dielectric film 119 having been trimmed around poly-Si spacers 120. According to an exemplary embodiment, dielectric film 119 is trimmed using RIE. The results are trimmed dielectric portions 122. Next, as shown in FIG. 7, poly-Si layer 105 is etched selectively with respect to oxide layer 106 and hardmask 114, resulting in patterned poly-Si 121. As shown in FIG. 7, the poly-Si etch also recesses poly-Si spacers 120.

Figure 8:
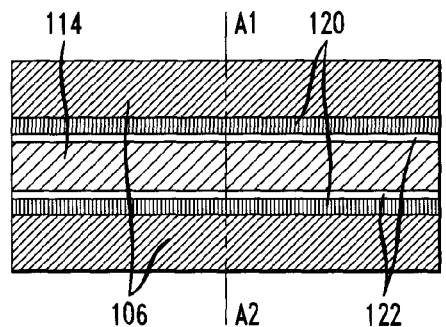
FIG. 8 is a diagram illustrating a top-down view of the structure of FIG. 7 according to an embodiment of the present invention.

FIG. 8 is a diagram illustrating another perspective, i.e., a top-down view, of the structure of FIG. 7. Specifically, what is presented in FIG. 7 is a cross-sectional view of a cut taken through line A1-A2 of FIG. 8.

Figure 9:
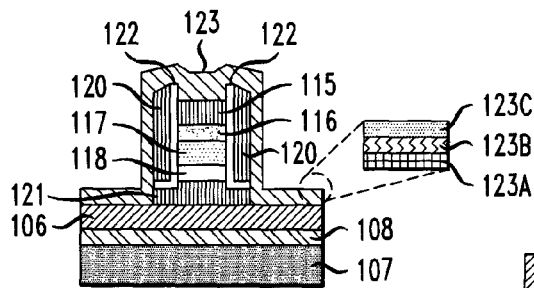
FIG. 9 is a cross-sectional diagram illustrating a metal stack having been deposited over a portion of the structure of FIG. 7 according to an embodiment of the present invention.

Hardmask 114 is removed and a metal stack is then deposited over the fin. Namely, FIG. 9 is a cross-sectional diagram illustrating metal stack 123 having been deposited over a portion of the structure of FIG. 7, i.e., over poly-Si 115, poly-Si spacers 120 and oxide layer 106. Metal stack 123 can be formed by first blanket depositing its three constituent layers (see below) over the structure and then patterning the layers using conventional lithography and RIE to define the metal stack 123. The gate line formed by metal stack 123 is shown illustrated, for example, in the top-down view of FIG. 10 (described below).

According to the exemplary embodiment shown in FIG. 9, metal stack 123 is made up of three layers, a silicide forming metal layer 123A, a capping layer 123B and an oxide cap layer 123C. A suitable metal for use in silicide forming metal layer 123A includes, but is not limited to, nickel (Ni), platinum (Pt) and tungsten (W). A suitable material for use in capping layer 123B includes, but is not limited to, titanium nitride (TiN). Specifically, silicide forming metal layer 123A is deposited over poly-Si 115, poly-Si spacers 120 and oxide layer 106 using physical vapor deposition (PVD). The thickness of silicide forming metal layer 123A depends on the metal element used and on the thickness of the poly-Si layer that needs to be converted to silicide (see below). For example, for each nm of Ni, about 1.83 nm of poly-Si is consumed when nickel silicide (NiSi) is formed. Similarly for each nm of Pt, about 1.32 nm of poly-Si is consumed when forming platinum silicide (PtSi). Capping layer 123B is then deposited over silicide forming metal layer 123A using PVD or ALD. Capping layer 123B serves as an oxidation barrier and can have a thickness of from about two nm to about 25 nm. Oxide cap layer 123C is then deposited over capping layer 123B using CVD or ALD to a thickness of from about 20 nm to about 100 nm.

At this point in the process it should be noted that a portion of the fin, namely patterned SOI 117 will form a nanowire structure of the MOSFET. Thus, the term "nanowire" may also be used herein when referring to patterned SOI 117. Further, the portion of the nanowire/patterned SOI 117 beneath metal stack 123 will serve as a channel region of the MOSFET. Accordingly, those portions of the nanowire/patterned SOI 117 outside of the channel region (i.e., that are not beneath metal stack 123), also referred to herein as "nanowire extensions," will serve as source and drain regions. Moreover, metal stack 123, which will be fully silicided (FUSI) as described below, will serve as a wrapped-around gate of the MOSFET.

As shown in FIG. 9, silicide forming metal layer 123A is in contact with the poly-Si regions surrounding the nanowire channel, i.e., silicide forming metal layer 123A is in contact with each of patterned poly-Si 115, poly-Si spacers 120 and patterned poly-Si 121, and will serve to form corresponding metal silicide regions surrounding the nanowire channel, as described in detail below. Further, the metal silicide will only be formed in regions of the MOSFET surrounded by the gate, namely the nanowire channel, since the silicide forming metal is not present elsewhere.

Figure 10:
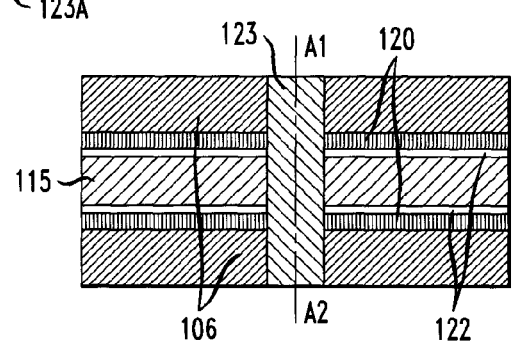
FIG. 10 is a diagram illustrating a top-down view of the structure of FIG. 9 according to an embodiment of the present invention.

FIG. 10 is a diagram illustrating another perspective, i.e., a top-down view, of the structure of FIG. 9. Specifically, what is presented in FIG. 9 is a cross-sectional view of a cut taken through line A1-A2 of FIG. 10. As shown in FIG. 10, the metal stack 123 is patterned to define the gate line. It is notable that the gate line etch (see description of FIG. 9, above) does not need to be isotropic since the nanowire was not suspended.

Figure 11:
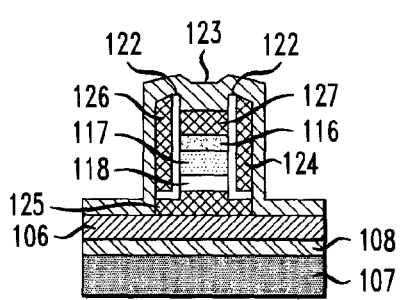
FIG. 11 is a cross-sectional diagram illustrating metal silicide regions having been formed surrounding a nanowire portion of the fin which will serve as a channel region according to an embodiment of the present invention.

Metal stack 123 is then annealed to react silicide forming metal layer 123A with the poly-Si regions (i.e., patterned poly-Si 115, poly-Si spacers 120 and patterned poly-Si 121) surrounding the nanowire. As an example, to form the lowest resistivity phase of NiSi, an annealing temperature of from about 400° C. to about 450° C. is typically employed. In another example, when PtSi is formed the annealing temperature is typically chosen in the range of from about 350° C. to about 550° C. The silicide formation anneal is carried out by a rapid thermal annealing (RTA) tool in an ambient of nitrogen ($N_2$), with typical annealing times of from about five seconds to about 60 seconds. The result of this reaction, the formation of metal silicide regions, is shown in FIG. 11. Namely, FIG. 11 is a cross-sectional diagram illustrating metal silicide regions 124, 125, 126 and 127 having been formed surrounding the nanowire (i.e., a wrapped-around gate). Specifically, as shown in FIG. 11, metal silicide regions 124/126, 125 and 127 are adjacent to the sides, bottom and top of the nanowire, respectively, and are separated from each of the sides, bottom and top of the nanowire by an oxide layer, i.e., by trimmed dielectric portions 122, patterned BG-oxide 118 and patterned TG-oxide 116, respectively, which serve as gate dielectrics. Metal stack 123 covers the metal silicide regions.

It is notable that since the gate dielectrics that separate the metal silicide regions from the sides, bottom and top of the nanowire are formed separately from one another, the properties (such as composition and/or thickness) of each dielectric layer can be varied independently of the other dielectric layers. By way of example only, patterned BG-oxide 118 and patterned TG-oxide 116 can be configured to be thicker than trimmed dielectric portions 122. Further, in the instant description all of the gate dielectrics, i.e., trimmed dielectric portions 122 (e.g., $HfO_2$), patterned BG-oxide 118 and patterned TG-oxide 116, have been oxides, but that does not have to be the case. For example, one or more of the gate dielectrics separating the metal silicide regions from the top, bottom and sides of the nanowire can have a different composition from the others (e.g., can be composed of a nitride material). Thus, in general, while all of the gate dielectric layers separating the metal silicide regions from the sides, bottom and top of the nanowire can have the same composition and/or thickness as one another, this is not required, and in fact it may be desirable to vary the composition and/or thickness of one or more of the gate dielectric layers relative to the others.

Figure 12:
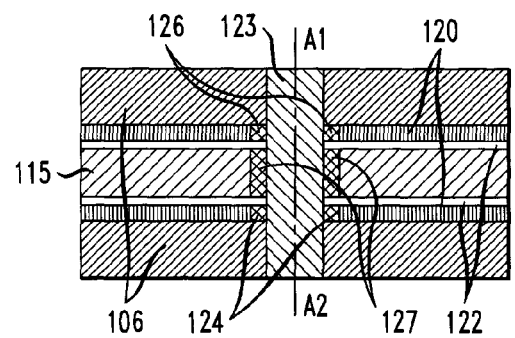
FIG. 12 is a diagram illustrating a top-down view of the structure of FIG. 11 according to an embodiment of the present invention.

FIG. 12 is a diagram illustrating another perspective, i.e., a top-down view, of the structure of FIG. 11. Specifically, what is presented in FIG. 11 is a cross-sectional view of a cut taken through line A1-A2 of FIG. 12. The result, as shown for example in FIG. 11, is a FUSI gate surrounding the nanowire channel. FIG. 12 also shows that the silicide region extends beyond the edge of the gate line formed by metal stack 123 as indicated by silicide regions 124 and 126. These silicide extensions are typically minimized by keeping the silicide formation anneal time short.

Advantageously, with the present techniques, the gate fabrication process decouples the gate line definition from the removal of the gate material shadowed by the nanowire source/drain extensions. The gate of the MOSFET is formed by converting poly-Si to silicide (a FUSI process) and without ever suspending the nanowire, thereby avoiding the problems described above. The later etching of the poly-Si shadowed by the nanowire extensions does not attack the silicide gate as in the case where the gate material was also poly-Si.

Figure 13:
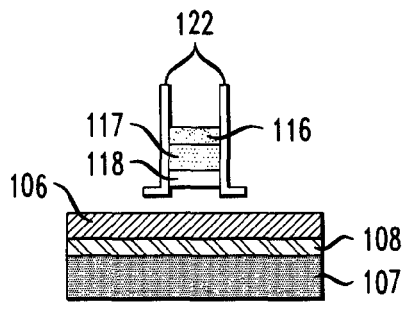
FIG. 13 is a cross-sectional diagram illustrating suspension of the nanowire outside the channel region according to an embodiment of the present invention.
Figure 14:
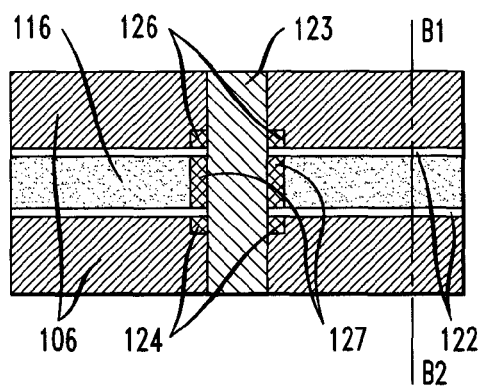
FIG. 14 is a diagram illustrating a top-down view of the structure of FIG. 13 according to an embodiment of the present invention.

A selective isotropic etch is then used to suspend the nanowire outside the channel region by removing the patterned poly-Si 121 from under the nanowire outside of the channel region as is shown in FIG. 13. The etching also removes patterned poly-Si 115 and poly-Si spacers 120. This etch does not modify the silicided-gate dimensions. FIG. 14 is a diagram illustrating another perspective, i.e., a top-down view, of the structure of FIG. 13. Specifically, what is presented in FIG. 13 is a cross-sectional view of a cut taken through line B1-B2 of FIG. 14.

Figure 15:
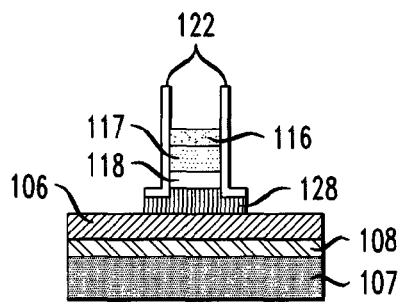
FIG. 15 is a cross-sectional diagram illustrating a spacer having been formed under the nanowire outside of the channel region according to an embodiment of the present invention.
Figure 16:
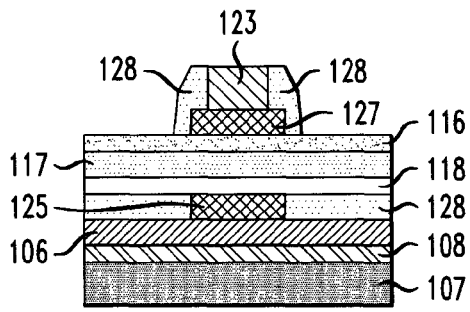
FIG. 16 is a cross-sectional diagram illustrating the spacer having been formed within the channel region according to an embodiment of the present invention.

Spacers are then formed under the nanowire outside of the channel region (see FIG. 15) and adjacent to the gate in the channel region (see FIG. 16). Namely, FIG. 15 is a cross-sectional diagram illustrating spacer 128 having been formed under the nanowire, i.e., under patterned BG-oxide 118, outside of the channel region and FIG. 16 is a cross-sectional diagram illustrating spacers 128 having been formed within the channel region, i.e., on opposite sides of metal stack 123. FIGS. 15 and 16 depict the same spacers, formed as described below, just in different locations in the MOSFET. According to an exemplary embodiment, spacers 128 are formed by first depositing a conformal spacer film over the structure, e.g., of FIG. 13, and then etching the spacer film by RIE to form spacers 128. The spacer material fills under the nanowire as shown in FIG. 15 (since the nanowire was released outside the channel region as described above) and is not etched due to RIE being directional. Suitable spacer materials include, but are not limited to, silicon nitride ($Si_3N_4$).

Figure 17:
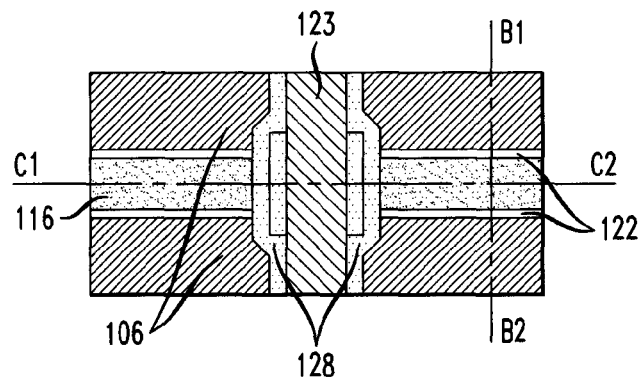
FIG. 17 is a diagram illustrating a top-down view of the structure of FIGS. 15 and 16 according to an embodiment of the present invention.

FIG. 17 is a diagram illustrating another perspective, i.e., a top-down view, of the structure of FIGS. 15 and 16. Specifically, what is presented in FIG. 15 is a cross-sectional view of a cut taken through line B1-B2 of FIG. 17, and what is presented in FIG. 16 is a cross-sectional view of a cut taken through line C1-C2 of FIG. 17.

Patterned TG-oxide 116 and trimmed dielectric 122 are etched (e.g., with DHF) outside of the channel region to expose the nanowire in the source and drain regions. A portion (or all) of patterned BG-oxide 118 may also be etched (see, for example, FIG. 18, described below).

Figure 18:
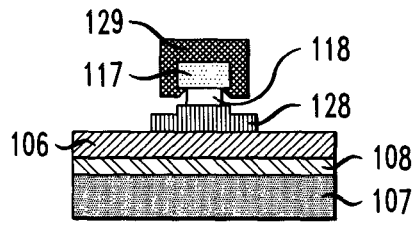
FIG. 18 is a cross-sectional diagram illustrating a raised source/drain having been formed on the nanowire in a source/drain region according to an embodiment of the present invention.
Figure 19:
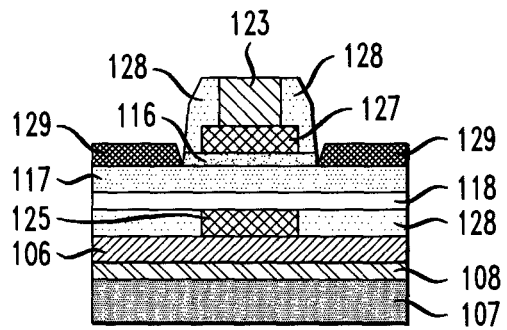
FIG. 19 is a cross-sectional diagram illustrating raised source/drains having been formed in both source/drain regions according to an embodiment of the present invention.

Selective Si or silicon germanium (SiGe) epitaxy is applied to thicken the portions of the nanowire in the source and drain regions (as highlighted above these portions are also referred to herein as "nanowire extensions") forming a raised source and drain (see FIGS. 18 and 19). Namely, FIG. 18 is a cross-sectional diagram illustrating raised source/drain 129 having been formed on the nanowire in one of the source/drain regions, and FIG. 19 is a cross-sectional diagram illustrating raised source/drains 129 having been formed in both source/drain regions outside of the channel region. FIGS. 18 and 19 depict the same raised source/drains just in various locations in the MOSFET.

The process used to form raised source/drain 129 is similar the one practiced with planar SOI technology for forming a raised source and drain with the main difference being the limitation to low growth temperature as explained below. The growth temperature of the raised source/drain 129 is kept below a temperature that could lead to a phase change of metal silicide region 127. By way of example only, if metal silicide region 127 is NiSi it may be desirable to keep the growth temperature below 650° C. to avoid a phase change to $NiSi_2$ which has a higher resistivity. The temperature at which a phase change would occur for a given metal silicide could be easily obtained by one of skill in the art. Selective growth is more easily obtained with higher concentrations of germanium (Ge) in SiGe growth. In the case of pure Ge growth, the growth temperature can be as low as 300° C. Another reason to maintain a low growth temperature is to avoid nanowire agglomeration.

Figure 20:
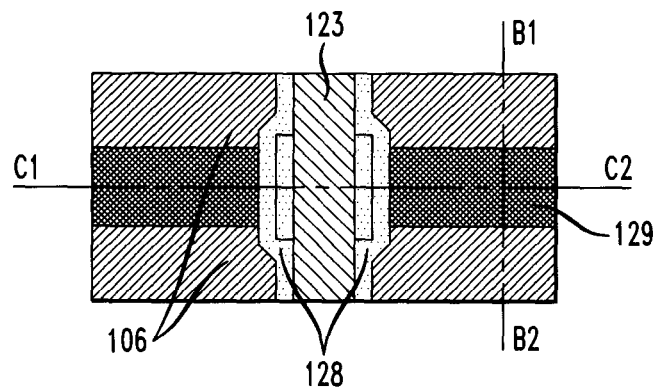
FIG. 20 is a diagram illustrating a top-down view of the structure of FIGS. 18 and 19 according to an embodiment of the present invention.

FIG. 20 is a diagram illustrating another perspective, i.e., a top-down view, of the structure of FIGS. 18 and 19. Specifically, what is presented in FIG. 18 is a cross-sectional view of a cut taken through line B1-B2 of FIG. 20, and what is presented in FIG. 19 is a cross-sectional view of a cut taken through line C1-C2 of FIG. 20.

Figure 21:
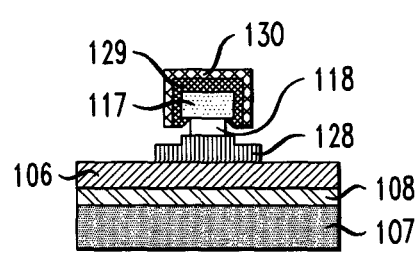
FIG. 21 is a cross-sectional diagram illustrating a silicide having been formed over the raised source/drains in one of the source drain regions according to an embodiment of the present invention.
Figure 22:
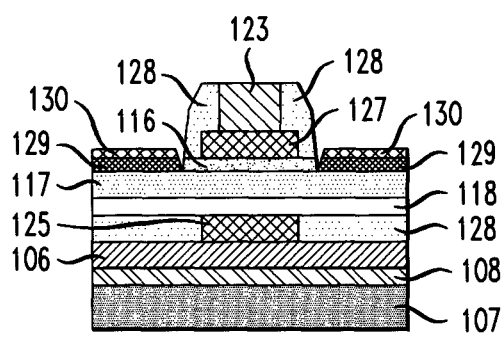
FIG. 22 is a cross-sectional diagram illustrating the silicide having been formed over both of the raised source/drains according to an embodiment of the present invention.

A self-aligned silicide (salicide) process is then used to form a silicide over the thickened nanowire extensions, i.e., over the raised source/drains (see FIGS. 21 and 22). FIG. 21 is a cross-sectional diagram illustrating silicide 130 having been formed over raised source/drain 129 in one of the source drain regions, and FIG. 22 is a cross-sectional diagram illustrating silicide 130 having been formed over both raised source/drains 129. FIGS. 21 and 22 depict the same silicide just in various locations in the MOSFET. As an example to a salicide process, a blanket Ni film is first deposited over the structure and then annealed by RTA at a temperature of from about 400° C. to about 450° C. for a duration of from about five seconds to about 30 seconds to form NiSi. The unreacted Ni deposited over dielectric surfaces is then etched selectively with respect to the NiSi regions. For a selective etch a Piranha solution (10:1 $H_2O_2:H_2SO_4$ at 65° C.) can be used.

Silicide 130 is independent of the gate metal silicide and thus does not need to be the same as the gate metal silicide 127. For example tungsten silicide ($WSi_2$) can be used for the gate metal silicide 127 while NiSi can be used for the nanowire extensions silicide 130.

Figure 23:
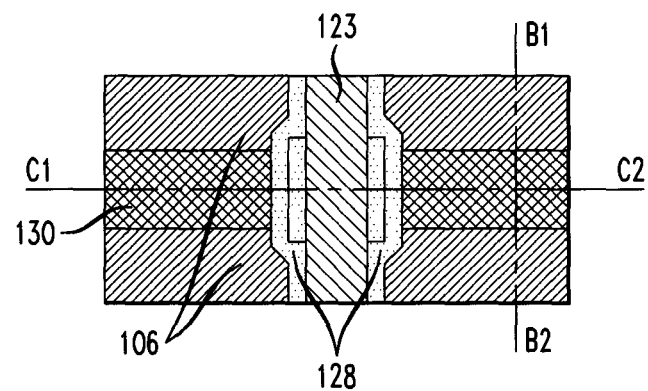
FIG. 23 is a diagram illustrating a top-down view of the structure of FIGS. 21 and 22 according to an embodiment of the present invention.

FIG. 23 is a diagram illustrating another perspective, i.e., a top-down view, of the structure of FIGS. 21 and 22. Specifically, what is presented in FIG. 21 is a cross-sectional view of a cut taken through line B1-B2 of FIG. 23, and what is presented in FIG. 22 is a cross-sectional view of a cut taken through line C1-C2 of FIG. 23. Contacts to the source drain and gate of the MOSFET (not shown) are then fabricated by conventional back-end-of-line (BEOL) methods to complete the MOSFET fabrication.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a MOSFET, comprising the steps of:

forming a nanowire channel by patterning a fin in a wafer comprising a first poly-silicon layer, a first dielectric layer over the first poly-silicon layer, a silicon-on-insulator layer over the first dielectric layer, a second dielectric layer over the silicon-on-insulator layer and a second poly-silicon layer over the second dielectric layer, wherein the patterned silicon-on-insulator layer forms a nanowire, a portion of which serves as the channel;

forming a fully silicided gate surrounding the nanowire channel by: (a) forming poly-silicon spacers on opposite sides of the fin, (b) depositing a metal stack over a portion of the fin by: depositing a silicide forming metal layer over the fin, depositing a capping layer having a thickness of from about 2 nm to about 25 nm over the silicide forming metal layer, and depositing an oxide cap layer over the capping layer, such that the metal stack comprises a silicide forming metal in contact with the patterned first and second poly-silicon layers and with the poly-silicon spacers, and (c) converting the first and second poly-silicon layers and the poly-silicon spacers to a silicide by annealing the metal stack to react the silicide forming metal with the patterned first and second poly-silicon layers and the poly-silicon spacers to form metal silicide regions adjacent to a top, bottom and sides of the portion of the nanowire that serves as the channel; and forming a raised source and drain connected by the nanowire channel.

2. The method of claim 1, wherein the silicide forming metal comprises a metal selected from the group consisting of: nickel, platinum and tungsten.

3. The method of claim 1, wherein the silicide forming metal comprises nickel.

4. The method of claim 1, wherein the capping layer comprises titanium nitride.

5. The method of claim 1, wherein the oxide cap layer is deposited to a thickness of from about 20 nm to about 100 nm.

6. The method of claim 1, further comprising the step of: forming spacers adjacent to the gate.

7. The method of claim 6, wherein the spacers comprise silicon nitride.

8. The method of claim 1, further comprising the step of: forming a silicide over the raised source and drain.

9. A method of fabricating a MOSFET, comprising the steps of:

forming a nanowire channel by patterning a fin in a wafer comprising a first poly-silicon layer, a first dielectric layer over the first poly-silicon layer, a silicon-on-insulator layer over the first dielectric layer, a second dielectric layer over the silicon-on-insulator layer and a second poly-silicon layer over the second dielectric layer, wherein the patterned silicon-on-insulator layer forms a nanowire, a portion of which serves as the channel;

forming a fully silicided gate surrounding the nanowire channel by: (a) forming poly-silicon spacers on opposite sides of the fin, (b) depositing a metal stack over a portion of the fin by: depositing a silicide forming metal layer over the fin, depositing a capping layer over the silicide forming metal layer, and depositing an oxide cap layer to a thickness of from about 20 nm to about 100 nm over the capping layer, such that the metal stack comprises a silicide forming metal in contact with the patterned first and second poly-silicon layers and with the poly-silicon spacers, and (c) converting the first and second poly-silicon layers and the poly-silicon spacers to a silicide by annealing the metal stack to react the silicide forming metal with the patterned first and second poly-silicon layers and the poly-silicon spacers to form metal silicide regions adjacent to a top, bottom and sides of the portion of the nanowire that serves as the channel; and forming a raised source and drain connected by the nanowire channel.

10. The method of claim 9, wherein the silicide forming metal comprises a metal selected from the group consisting of: nickel, platinum and tungsten.

11. The method of claim 9, wherein the silicide forming metal comprises nickel.

12. The method of claim 9, wherein the capping layer comprises titanium nitride.

13. The method of claim 9, wherein the capping layer has a thickness of from about 2 nm to about 25 nm.

14. The method of claim 9, further comprising the step of: forming spacers adjacent to the gate.

15. The method of claim 14, wherein the spacers comprise silicon nitride.

16. The method of claim 9, further comprising the step of: forming a silicide over the raised source and drain.

* * * * *